(12) United States Patent  (10) Patent No.: US 7,271,389 B2
August et al.  (45) Date of Patent: Sep. 18, 2007

(54) NEUTRON DETECTION DEVICE AND METHOD OF MANUFACTURE

(75) Inventors: Robert A. August, Solomons, MD (US); Harold L. Hughes, West River, MD (US); Patrick J. McMarr, Springfield, VA (US); Robert R. Whitlock, Bethesda, MD (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 122 days.

(21) Appl. No.: 10/693,847

(22) Filed: Oct. 20, 2003

(65) Prior Publication Data

US 2005/0082489 A1  Apr. 21, 2005

(51) Int. Cl.
*G01T 3/08* (2006.01)
(52) U.S. Cl. .................. 250/370.05; 257/252
(58) Field of Classification Search ........... 250/370.05; 257/252
See application file for complete search history.

(56) References Cited

U.S. PATENT DOCUMENTS

| | | | |
|---|---|---|---|
| 5,913,131 A * | 6/1999 | Hossain et al. ............. | 438/423 |
| 6,075,261 A | 6/2000 | Hossain et al. | |
| 6,259,099 B1 | 7/2001 | Foulon | |
| 2004/0178337 A1* | 9/2004 | Kurkoski et al. ........ | 250/269.4 |
| 2005/0067695 A1* | 3/2005 | Brandl et al. ............... | 257/724 |

OTHER PUBLICATIONS

McGregor et al, "Self-Biased Boron-10 Coated High-Purity Epitaxial GaAs Thermal Neutron Detector" IEEE transactions on nuclear science, vol. 47, No., Aug. 2000.

McGregor et al, "Recent Results From Thin-Film-Coated Semiconductor Neutron Detectors" X-Ray and Gamma-Ray Detector and Application IV, vol. 4784 (2002).

Haque et al, "Neutron dosimetry employing soft errors in dynamic random access memories" Phys. Med. Biol., 1989 vol. 34, No. 9, 1195-1202 Printed in the UK.

Phillips et al, "Feasibility of a Neutron Detector-Dosemeter Based on Single-Event Upsets in Dynamic Random-Access Memories" Radiation Protection Dosimetry vol. 101, Nos. 1-4, pp. 129-132 (2002) Nuclear Technology Publishing.

Robertson et al, "A class of boron-rich solid-state neutron detectors" Applied Physics Letters vol. 80, No. 19, May 13, 2002.

Guarini et at, "Electrical Integrity of State-of-the-Art 0.13 um SOI CMOS Devices and Circuits Transferred for Three-Dimensional (3D) Integrated Circuit (IC) Fabrication" 0-7803-7462-2/02 2002 IEEE.

(Continued)

*Primary Examiner*—David Porta
*Assistant Examiner*—Djura Malevic
(74) *Attorney, Agent, or Firm*—John J. Karasek; Amy Ressing

(57) ABSTRACT

A neutron detection device includes a neutron conversion layer in close proximity to an active semiconductor layer. The device is preferably based on the modification of existing conventional semiconductor memory devices. The device employs a conventional SRAM memory device that includes an SOI substrate. The SOI substrate includes an active semiconductor device layer, a base substrate and an insulating layer between the active semiconductor device layer and the base substrate. The base substrate layer is removed from the memory device by lapping, grinding and/or etching to expose the insulating layer. A neutron conversion layer is then formed on the insulating layer. The close proximity of the neutron conversion layer to the active semiconductor device layer yields substantial improvements in device sensitivity.

53 Claims, 6 Drawing Sheets

OTHER PUBLICATIONS

Arita et al, "Experimental Investigation of Thermal Neutron-Induced Single Event Upset in Static Random Access Memories" Jpn. J. Appl. Phys vol. 40 (2001) pp. L151-L153 Part 2, No. 2B, Feb. 15, 2001.

Hughes et al, "Radiation Effects and Hardening of Mos Technology: Devices and Circuits" Preprint IEEE Trans. Nucl. Sci. Jun. 2003.

Lund et al. "Neutron Dosimeter Using a Dynamic Random Access Memory as a Sensor" IEEE *Transactions on Nuclear Science*, vol. 33, No. 1, Feb. 1996.

Petersen et al. "Calculation of Cosmic-Ray Induced Soft Upsets and Scaling in VLSI Devices*." IEEE Transaction on Nuclear Science, vol. NS-29, No. 6, Dec. 1982.

Davis "Use of Computer Memory Chips as The Basis For a Digital Albedo Neutron Dosimeter*" Health Physics vol. 49, No. 2 (Aug.), pp. 259-265, 1985 Printed in the U.S.A.

McGregor, et al, "Design considerations for thin film coated semiconductor thermal neutron detectors-I: basics regarding alpha particle emitting neutron reactive films", Nuclear Instruments and Methods in Physics Research, Section—A: Accelerators, Spectrometers, Detectors and Associated Equipment, Amsterdam, NL, vol. 500, No. 1-3, Mar. 11, 2003, pp. 272-308.

Barron, "CVD of SiO, and Related Materials: an Overview,", Advanced Materials for Optics and Electronics, vol. 6, 101-114 (1996).

* cited by examiner

NEUTRON DETECTION DEVICE AND METHOD OF MANUFACTURE

BACKGROUND OF THE INVENTION

The present invention is directed in general to a neutron detection device and a method of manufacturing a neutron detection device. The present invention is specifically directed to a semiconductor device for the detection of neutrons that utilizes a neutron conversion layer in close proximity to a conventional memory cell structure.

The development of nuclear weapons gave rise to several urgent applications for highly sensitive neutron detectors. The applications included safeguarding nuclear materials and weapons, treaty verification, anti-proliferation, and the recovery of lost military payloads. More recently, however, the need to guard against nuclear smuggling, the potential of a radiological weapon (so called "dirty" bombs), and terrorist acts, has given rise to an urgent need to perform neutron surveillance at border and port facilities, transportation systems and other places where large amounts of a cargo or people pass by or through on a regular basis. Such neutron surveillance must be accomplished without undue restriction or disruption of traffic flow and events.

One class of conventional neutron detectors has been based on the phenomenon of scintillation, which is a result of photon-emitting transitions that occur in the wake of energetic charged nuclei released from reactions between incident neutrons and atomic nuclei. Scintillation devices include a light-transmissive neutron sensitive material (either a gas or a liquid) that generates light upon receipt of incident neutrons. The scintillation devices are typically coupled to a photomultiplier tube to generate an analog electrical signal based on the production of the light within the scintillation material. The analog signal is a representation of the incident neutron irradiation. Another class of conventional neutron detector is the gas filled counter, typically based on gaseous helium-3 contained in high pressure tubes. In particular, the helium-3 filled tubes are delicate, require careful handling, and can indicate false positives when abruptly moved or struck. These types of conventional neutron detectors are effective in many types of field operations, but they are not suitable for operations requiring compact and highly sensitive devices capable of functioning for long periods of time with low power consumption.

With the advent of solid state electronics, it was realized silicon-based semiconductor devices could be used to sense alpha particles emitted from a neutron converter material in which an (n. alpha) reaction had taken place. The role of the converter material is to convert incident neutrons into emitted charged particles which are more readily sensed. When the emitted charged particle transits a semiconductor device, it liberates charges in its wake, and these charges may be collected and used to sense the event stimulated by the initial neutron reaction. Such devices therefore serve as neutron detectors. Initial demonstrations of such a concept used free standing converter foils placed near a silicon detector such as a PIN diode. It is more common now to utilize films of converter material placed in contact with or deposited directly upon semiconductor detectors. Lithium metal has been used for this purpose, although the chemical reactivity of the lithium metal leads to shorter detector life. Greater life has been obtained with compounds of lithium such as LiF, a hard crystalline material. Boron metal has also been applied directly to silicon devices. See, "Recent Results From Thin-Film-Coated Semiconductor Neutron Detectors", D. S. McGregor et al., X-Ray and Gamma-Ray Detectors and Applications IV, Proceedings of SPIE, Vol. 4784 (2002), the contents of which are incorporated herein by reference.

The use of diode structures in neutron detectors, however, has its own set of drawbacks and limitations. The internal noise level of an uncooled diode is appreciable, and consequently it is difficult, if not impossible, to measure low background levels of ambient thermal neutrons in the surrounding area or to detect single neutron events. A typical diode also has a thick semiconductor layer in which charges are collected. Charges liberated by gamma rays are also collected in the thick semiconductor layer and these charges contribute to the non-neutron noise signal of the detector.

More recently, it has been proposed that a previously considered disadvantage of semiconductor memory cells be turned into an advantage with respect to neutron detection. Memory cells can be "hardened" against radiation to prevent errors induced by radiation. In fact, the importance of such memory integrity has been readily appreciated for many years in the field of computers, aviation and space flight. A radiation-induced bit error is known as a soft error if the affected memory cell subsequently responds to write commands. In contrast, the induced bit error is known as a hard error if subsequent attempts to change the state of the memory cell are ineffective. Both hard and soft errors are known as single event upsets (SEUs) or single event errors (SEEs) provided that a single incoming particle induces the error in the memory cell. The error events, which are detrimental when trying to maintain data integrity, can be used in a positive manner to detect radiation events by simply monitoring the radiation-induced charges in the states of the memory cells.

Attempts have been made to utilize commercial memory circuits with a neutron converter in order to use the SEU associated with the memory circuits for neutron detection. For example, boron has been used in the semiconductor industry as a dopant and in boron containing glass as a passivation layer that is used to cover the circuit-defining structures and to encapsulate a finished semiconductor chip. It has been demonstrated that $^{10}B$ in the dopant or borophosilicate glass (BPSG) passivation layer is responsible for sensitizing a circuit to neutron radiation. See, "Experimental Investigation of Thermal Neutron-Induced Single Event Upset in Static Random Access Memories". Y. Arita et al., Jpn. J. Appl. Phys. 40 (2001) pp L151-153, the contents of which are incorporated herein by reference. Accordingly, proposals have been made to coat boron on a conventional semiconductor memory chip containing a passivation layer or to first remove the passivation layer and then coat the chip with a boron converter material. U.S. Pat. No. 6,075,261 issued to Houssain et al. and entitled "Neutron Detecting Semiconductor Device", the contents of which are incorporated herein by reference, discloses one such attempt at utilizing a conventional semiconductor memory structure as a neutron detector, wherein a neutron-reactant material (converter) is coated over a conventional flash memory device. Alpha particles emitted by the boron typically must pass through the structural layers which define the circuit before they reach the active semiconductor. These efforts to date, however, have resulted in insensitive detectors primarily because the boron conversion material is not located close enough to the active semiconductor layer. Thus, alpha particles generated by the boron conversion material dissipate their energy in the intervening material and cannot generate a sufficient charge in the active semiconductor layer to cause an SEU.

In view of the above, it would be desirable to provide a neutron detection device that does not require the use of high pressure tubes or high voltages, is not sensitive to gamma radiations, is not sensitive to thermal noise, and operates with low power consumption, but yet is sensitive enough to permit the counting of single neutron events.

It would further be desirable to provide a neutron detection device of inexpensive design and manufacture.

Still further, it would be desirable to provide a method of manufacturing a neutron detection device that involved the modification on conventional memory devices, thereby permitting conventional memory devices to be converted to neutron detection devices.

SUMMARY OF THE INVENTION

The invention provides a neutron detection device which does not require the use of high pressure tubes or high voltages for its operation, is not sensitive to gamma radiations, is not sensitive to thermal noise, and operates at low power consumption, but yet is sensitive enough to permit the counting of single neutron events. The invention further provides a neutron detection device of inexpensive design and manufacture. The device is based on a novel architecture for fabricating charge-sensitive semiconductor circuit elements in close proximity to a neutron conversion layer, thereby enabling the circuit elements to sense charges produced in the semiconductor by transiting particles emitted from the reaction of a neutron with an atom of the conversion layer. One embodiment of the device may be fabricated by modification of existing conventional semiconductor memory devices, thereby enabling existing devices to be modified for use a neutron detectors.

The neutron detection device includes an active semiconductor layer including a plurality of charge-sensitive elements such as conventional memory cells, and a neutron conversion layer located in close proximity to the charge-sensitive elements. The neutron conversion layer produces particles which are detectable by the charge-sensitive elements when neutrons enter the conversion layer. The location of the neutron conversion layer in close proximity to the memory cells increases the sensitivity of the neutron detection device.

The neutron conversion layer may include boron or lithium. When an electrically conductive form of boron or boron containing composition is utilized, it is preferable to include an insulating layer located between the active semiconductor layer and the neutron conversion layer. Further, a barrier layer may be located between the neutron conversion layer and the insulating layer. The barrier layer preferably comprises silicon nitride. Additionally, more than one neutron conversion layer may be employed to improve sensitivity.

A preferred embodiment of the device employs a static random access (SRAM) memory circuit that is fabricated as a semiconductor-on-insulator (SOI) device. The SOI device includes a circuit structure layer comprising the structures by which the circuit is defined in an active semiconductor layer, the active semiconductor layer, and an insulating layer, the layers being arranged in the order just given. The insulating layer of SOI devices is typically approximately 200 nanometers thick. In this preferred embodiment, beneath the insulator of the SOI device is a neutron conversion layer in intimate contact with the insulating layer. The close proximity of the neutron conversion layer to the active semiconductor layer yields substantial improvements in device detection sensitivity. A barrier layer can also be incorporated by intimate contact between the neutron conversion layer and the active semiconductor layer to prevent diffusion of the neutron conversion material into the active semiconductor layer. Sensitivity can be further improved by adding a second neutron conversion layer in intimate contact with the first neutron conversion layer. It is also possible to provide an insulating neutron conversion layer in direct contact with the active semiconductor layer. It is further possible to provide a neutron conversion layer separated from the active semiconductor layer by a barrier layer provided between them, or by an insulating barrier layer in the case of a conducting conversion layer. Thin layers may be applied to surfaces to aid in maintaining the aforementioned intimate contacts.

In a preferred embodiment of manufacture, the neutron detection device is constructed from a conventional SRAM memory device that includes a SOI substrate. The SOI substrate includes an active semiconductor layer, a base substrate and an insulating layer between the active semiconductor layer and the base substrate. The base substrate layer is removed from the memory device by lapping, grinding and/or etching to expose the insulating layer. A neutron conversion layer is then formed on the insulating layer. The close proximity of the neutron conversion layer to the active semiconductor layer yields substantial improvements in device sensitivity.

Additional details and advantages of the invention will become apparent to those skilled in the art in view of the following detailed description of the preferred embodiments of the invention.

BRIEF DESCRIPTION OF THE DRAWINGS

The invention will be described with reference to certain preferred embodiments thereof and the accompanying drawings, wherein.

DETAILED DESCRIPTION OF THE PREFERRED EMBODIMENTS

This application hereby incorporates by reference the application entitled "Semiconductor Substrate Incorporating a Neutron Conversion Layer", filed on date even herewith, now issued at U.S. Pat. No. 6,867,444. The present invention is directed to a neutron detection device that utilizes a neutron conversion layer in close proximity to charge-sensitive elements such as conventional memory cells. Specifically, the device provides a neutron conversion layer in close proximity to the active semiconductor layer of a charge-sensitive electronic semiconductor device such as a semiconductor memory cell. In particular, the invention will be described with reference to an SRAM memory device formed on a SOI substrate. It will be understood, however, that the invention is not limited to the specifically disclosed embodiment disclosed with reference to silicon devices but may also be realized with other semiconductor materials, and that alpha-emitting neutron converters based on boron and lithium may be utilized as may other alpha emitters, proton emitters, or electron emitters, and may also be utilized with other charge-sensitive device structures such as dynamic random access memories (DRAMs), other types of random access memories, non-random access memories, charge coupled devices, charge injection devices, or other memory device structures and substrates.

Figure 1:
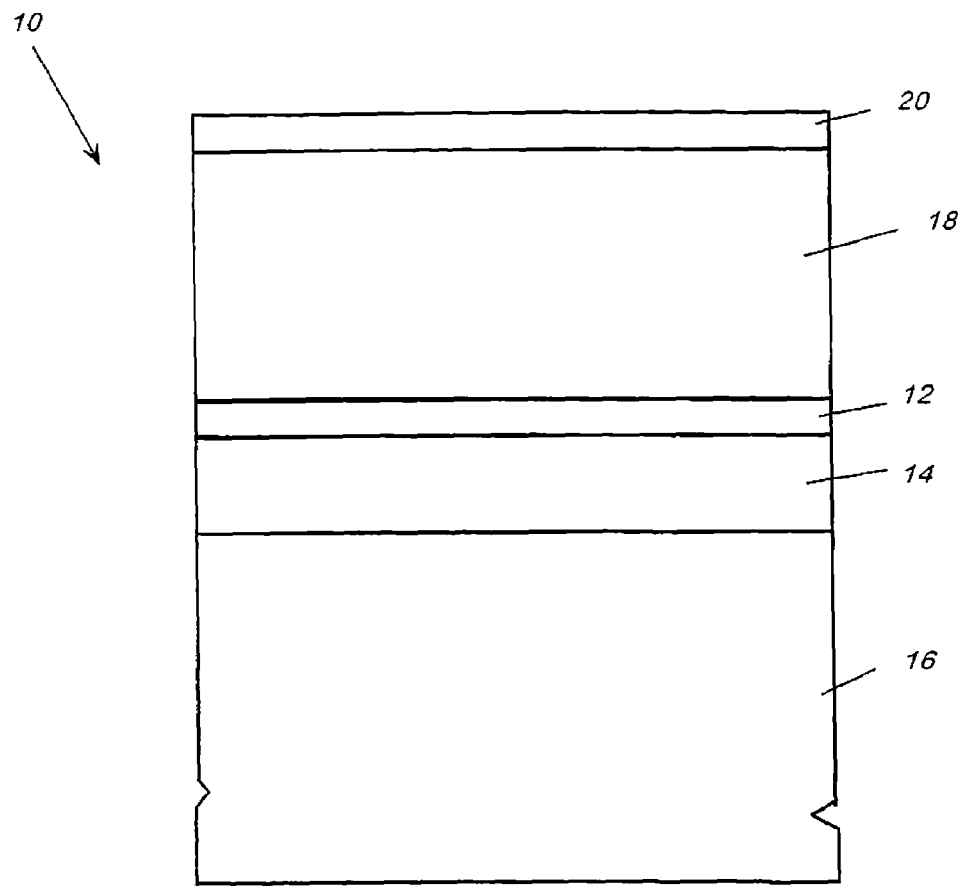
FIG. 1 illustrates a conventional semiconductor memory device that includes a SOI substrate.

FIG. 1 illustrates a conventional SRAM memory device formed on a SOI substrate. The SOI substrate 10 includes an active semiconductor layer 12, an insulating layer 14 (referred to as a buried oxide "BOX") and a base substrate 16. As will be readily understood by those skilled in the art, active charge-sensitive circuit elements such as individual memory cells are formed in part by modifications made within the active semiconductor layer 12 of the SOI substrate 10. Additional structural layers are then formed over the active semiconductor layer 12 to form the working circuitry and circuit elements of the charge-sensitive device. The additional structural layers, for example, may include interconnect layers, insulating layers and/or additional circuit elements. In FIG. 1, these additional structural layers are not illustrated in detail for the sake of simplicity of illustration, but will simply be shown as a single circuit structure layer 18. It is noted, however, that the thickness of the additional structural layers that form the circuit structure layer 18 is generally much greater than the active semiconductor layer 12 or in the insulating layer 14. It is also common to include a passivation layer 20 on top of the circuit structure layer 18.

Previous attempts at utilizing conventional memory devices have concentrated on coating a neutron conversion layer on top of the passivation layer 20 or on removing the passivation layer 20 and coating the neutron conversion layer on top of the circuit structure layer 18. However, the range of alpha particles emitted from a reaction between neutrons and a neutron conversion material (for example the isotope boron-10) is limited. The conventional attempts essentially placed the neutron conversion layer to far from the active semiconductor layer 12, i.e., beyond the range of the alpha particles resulting in poor sensitivity. Instead, the present invention places a neutron conversion layer in close proximity (either directly in contact with or effectively adjacent to as will be described) to the active semiconductor layer 12 without disrupting or damaging the additional structural layers provided in the circuit structure layer 18, as will be described below.

Figure 2:
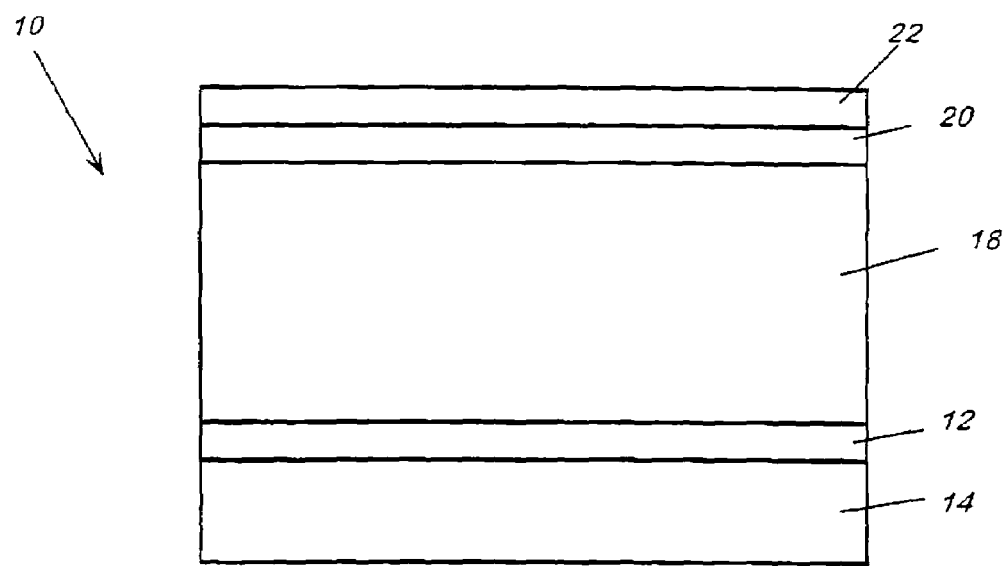
FIG. 2 illustrates the application of a bonding layer to the conventional memory device of FIG. 1 and the removal of the base substrate of the conventional memory device of FIG. 1.

Referring now to FIG. 2, a bonding layer 22 is first applied to a wafer containing at least one conventional semiconductor memory device of the type illustrated in FIG. 1. The bonding layer 22 may be a thick epoxy (as just one example) that is used to provide a mechanical connection to the wafer for processing purposes. As also shown in FIG. 2, the back of the wafer is processed to remove the base substrate 16. Lapping or similar mechanical removal processes are suitable for removing an initial portion of the base substrate 16 while leaving a sufficient remaining thickness to protect the insulating layer 14 from mechanical damage. The remaining thickness of the base substrate 16 is then removed by a chemical removal process such as etching with etchants such as hydrazine which stops at the insulating layer 14, or by a timed etching removal process with etchants such as TMAH.

Figure 3:
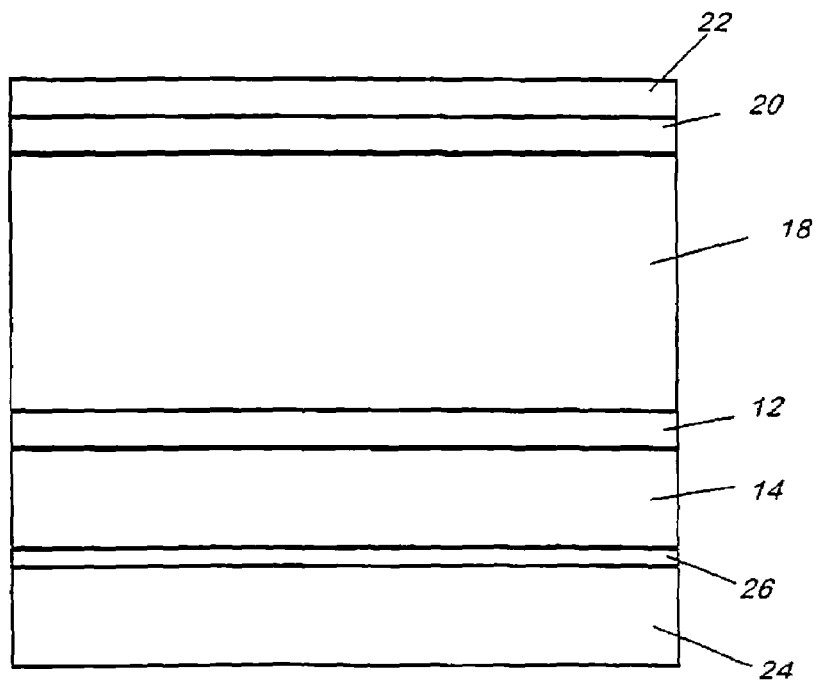
FIG. 3 illustrates the formation of a neutron conversion layer on the exposed insulating layer of FIG. 2.

Once the base substrate 16 has been substantially removed, a neutron conversion layer 24 is applied to the exposed insulating layer 14 as shown in FIG. 3. Sputter coating will produce lower thermal stresses in the circuit structure layer 18 during the deposition process, and, for fragile circuits, is therefore over, for example, high temperature processing. Prior to the application of the neutron conversion layer 24, a barrier layer 26 (for an example silicon nitride) may be deposited to prevent diffusion of the neutron conversion material into the active semiconductor layer 12. This process insures that the neutron conversion layer 24 is located in close proximity to the active semiconductor layer 12. If desired, an additional stability layer (not shown) such as epoxy may be applied to an outer layer if needed for additional mechanical stability.

The composition of the neutron conversion layer 24 may be a boron metal or composition enriched with boron-10. A metal layer requires that an insulating layer 14 be present. For example, a neutron conversion layer 24 having a thickness of 1.8 microns and an insulating layer 14 having a thickness of 200 nm maybe be employed.

Figure 4:
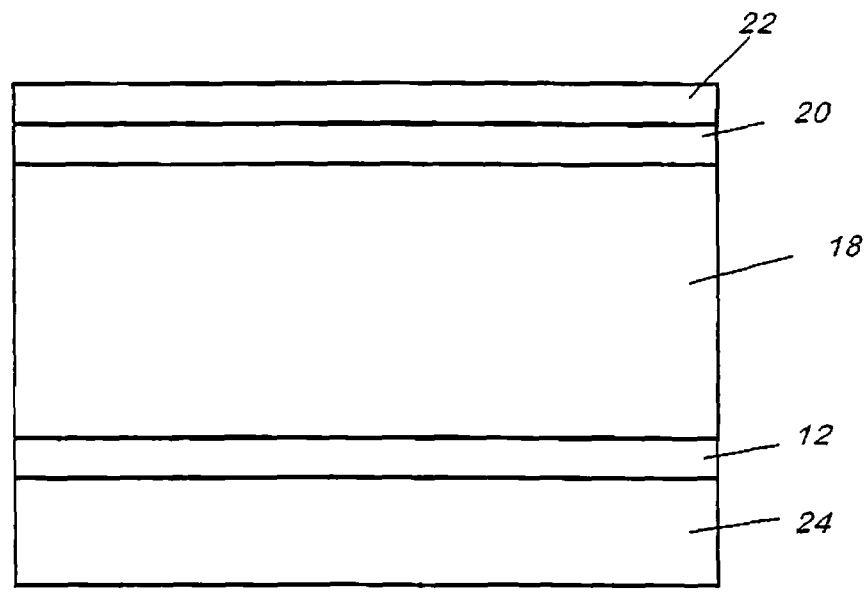
FIG. 4 illustrates the direct application of a neutron conversion layer to the active semiconductor layer of the conventional memory device.

Boron containing layers, however, have also been placed directly on silicon diodes. McGregor et al. (cited above) have shown that mechanically stable films of the required thickness can be achieved if provision for stress relief is included. It is well known that borophophosilicate glass (BPSG) is compatible with application on silicon devices, is an insulator, and is commonly used for passivation layers. A BPSG with 5% boron to serve as the insulating layer 14 and also the neutron conversion layer 24 may also be applied directly to the active semiconductor layer 12 as shown in FIG. 4. Other Boron compounds or compositions may also be used.

Figure 5:
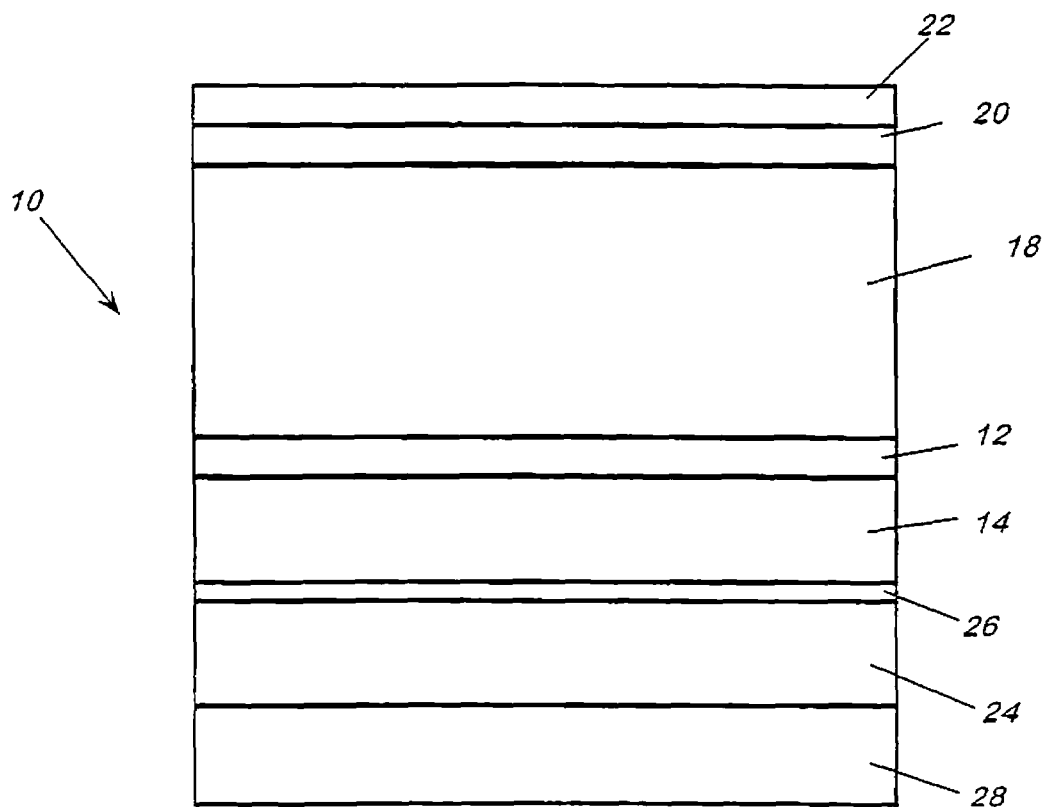
FIG. 5 illustrates the addition of a second neutron conversion layer to the device illustrated in FIG. 3.
Figure 6:
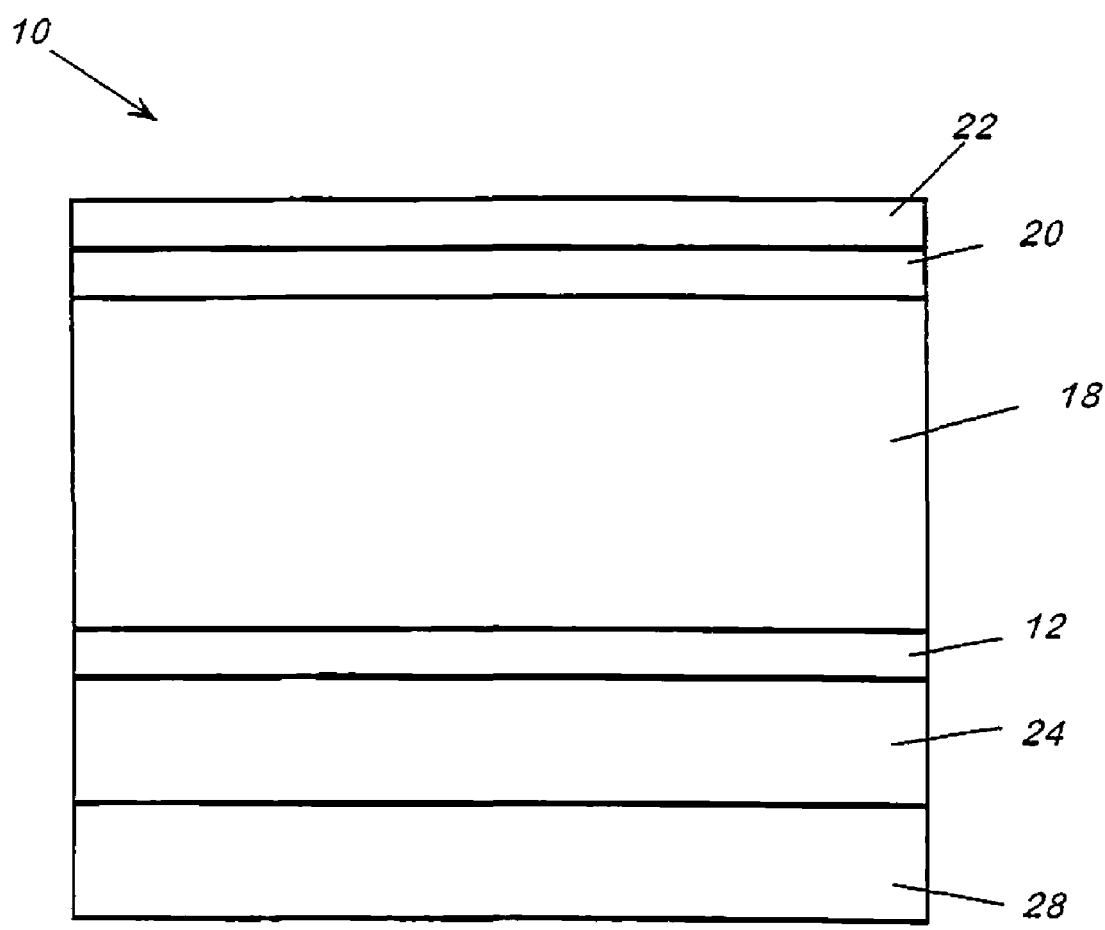
FIG. 6 illustrates the addition of a second neutron conversion layer to the device illustrated in FIG. 4.

The neutron conversion layer may also incorporate lithium. Lithium metal is highly reactive and has been used to sensitize diodes, but has generally shortened sensor life. Preferably, a stable material or composition such as $^{6}$LiF may be employed as the neutron conversion layer 24 or alternatively as a second neutron conversion layer 28 formed over the first neutron conversion layer 24 as shown in FIGS. 5 and 6. The alpha particles emitted by lithium have a longer range than those emitted by boron. For this reason, the use of two neutron conversion layers provides additional device sensitivity.

Figure 7:
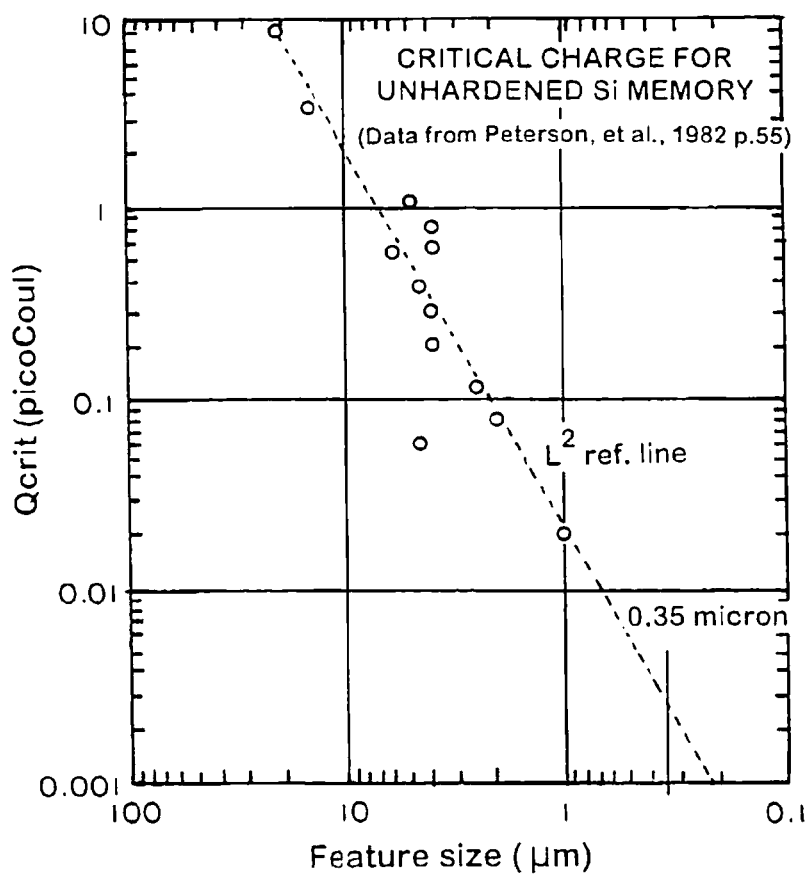
FIG. 7 is a graph illustrating the Qcrit for unhardened silicon memory cells based on feature size.

The susceptibility of memory devices to SEU in general has been extensively studied for many years, and has revealed an important quantity called the critical charge (Qcrit). The Qcrit is the amount of charge a memory cell must accumulate in order to produce a bit error. It has long been known that finer lithographic line widths lead to smaller cells, to smaller cell charge holding capacity, and thus to smaller Qcrit for higher density memory devices. A graph illustrating the Qcrit for unhardened silicon memory cells based on feature size is shown in FIG. 7. By locating the neutron conversion layer 24 in close proximity to the active semiconductor layer 12 in which memory cell elements are formed, sufficient charge can be generated by the alpha particles produced by the interaction of the neutrons with the boron-10.

Figure 8:
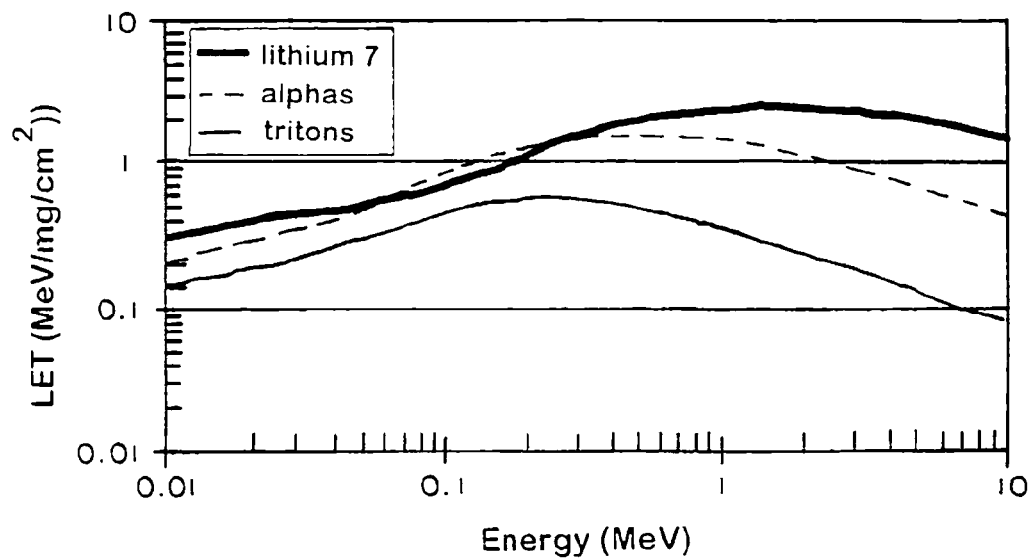
FIG. 8 is a plot of the Linear Energy Transfer (LET) of an alpha particle from the isotope boron-10 traversing silicon.

In the case of the device illustrated in FIG. 3, the typical 200 nm thickness of the active semiconductor layer 12 is much less than the range of the alpha particles generated in the neutron conversion layer 24. While the alpha will now reach the active semiconductor layer as required, only a fraction of the alpha energy will therefore be deposited in the active semiconductor layer 12 as it passes through that layer. The relevant quantity then becomes the amount of energy deposited along the track of the alpha particles, i.e., the Linear Energy Transfer (LET). The LET of an alpha particle from boron-10 traversing silicon is plotted in FIG. 8. (The initial energy of an alpha particle emitted by a boron-10 atom is approximately one and a half MeV.) It can be seen that the LET varies from about 1 to 1.5 MeV/(mg cm$^2$) over essentially the entire useful energy range of the alpha particle. Applying these limits to a 200 nm active semiconductor layer thickness gives a range of energy deposited in the active semiconductor layer 12 for normal incidence (the charge will increase for non-normal incidence with greater path lengths through the active silicon layer 12). From this range of deposited alpha energy (in MeV) the corresponding amount of charge (in pC) liberated in the active semiconductor layer can be calculated. See "Calculation of Cosmic-Ray Induced Soft Upsets and Scaling in VLSI Devices", E. L. Peterson et al., IEEE Transactions on Nuclear Science, NS-29/6, December 1982, 2055-63, the contents of which are incorporated herein by reference. For the illustrated example, the energy is 22.5 MeV/pC giving a value of about 2 to 3 femtocouloubs deposited in the active layer at normal incidence.

Figure 9:
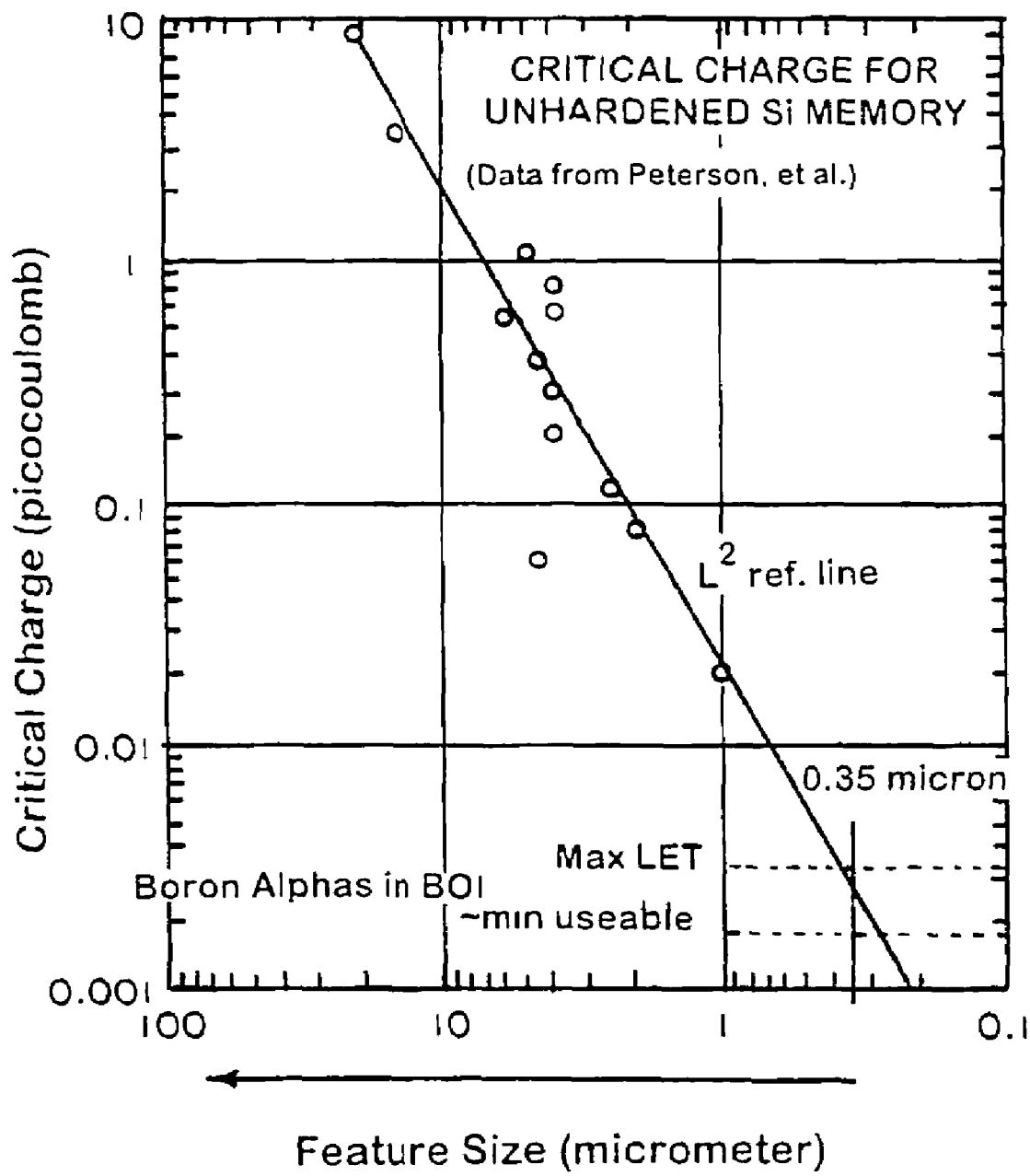
FIG. 9 is a graph including limiting values for liberating charge in the active semiconductor layer.

FIG. 7 can now be plotted as shown in FIG. 9 to include these limiting values for liberating charge in the active semiconductor layer. As shown in FIG. 9, the alpha particle produced will—at almost any point in its trajectory in silicon—supply an amount of charge comparable to Qcrit for a 0.35 micron line width SOI RAM cell. In other words, the proximally placed neutron conversion layer 24 will produce alpha particles sufficient to cause SEU in conventional SOI RAM structures. The resulting structure will be referred to as a neutron sensitive random access memory.

A neutron detector in accordance with the present invention can be utilized in a variety of applications. Just one notable application is in the area of monitoring the transportation of cargo. The low standby current draw of a device utilizing SRAM technology allows integrations of any desired duration to be performed without difficulty, as battery life can be on the order of years.

The invention has been described with reference to certain preferred embodiments thereof. It will be understood, however, that modifications and variations are possible within the scope of the appended claims. For example, an additional SRAM circuit can be applied to a single-sided neutron sensitive SRAM to produce a "sandwich" sensor, wherein the center layer is the neutron converter and SRAM circuits are provided on either side of the converter. Other stacking geometries may also be used. The technology for multiple stacked layers of silicon microcircuits has already been demonstrated. See "Electrical Integrity of State-of-the-Art 0.13 µm SOI CMOS Devices and Circuits Transferred for Three-Dimensional (3D) Integrated Circuit (IC) Fabrication", K. W. Guarini et al., IEDM Technical Digest, IEEE, (2002), the contents of which are incorporated herein by reference. Further, the invention has been described with reference to silicon memory SOI circuits, however, other semiconductor may be used to fabricate semiconductor-on-insulator RAM circuits and then can also be neutron-sensitized with one or more proximal neutron conversion materials in accordance with the invention to make neutron detectors. Still further, the invention is not limited to static RAM type memory devices, but can also be incorporated in other types of charge-sensitive devices.

Figure 1A:
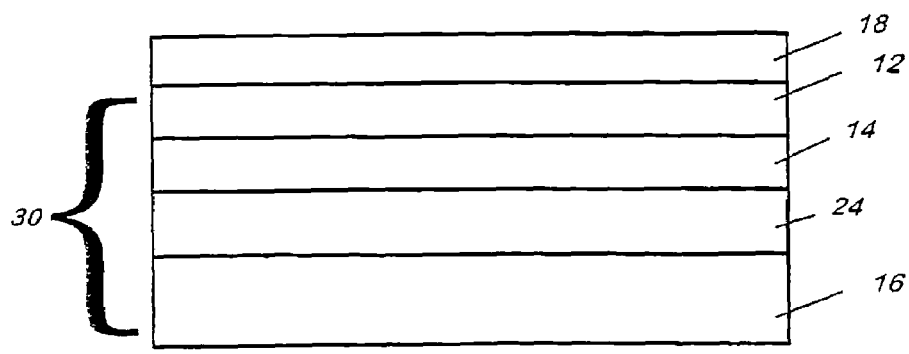
FIG. 1A illustrates a preferred embodiment of the neutron device structure

FIG. 1A illustrates one of the preferred embodiments of the neutron device structure. A neutron conversion layer 24 has been formed in close proximity to the active semiconductor layer 12 with insulating layer 14 being between the active semiconductor layer 12 and neutron conversion layer 24. The circuit structure layer 18 is above the active semiconductor layer 12. Optionally, a base substrate 16 can be added to the neutron conversion layer 24 for mechanical stability.

What is claimed is:

1. A neutron detection device comprising:
   an active semiconductor layer including a plurality of charge-sensitive cells;
   a first neutron conversion layer capable of converting neutrons into charged particles, wherein said neutron conversion layer is located in close proximity to the active semiconductor layer; and
   a second neutron conversion layer formed in proximity to the active semiconductor layer.

2. A neutron detection device as claimed in claim 1, further comprising an insulating layer located between the active semiconductor layer and the neutron conversion layers.

3. A neutron detection device as claimed in claim 1, further comprising a barrier layer located between the neutron conversion layer and the active semiconductor layers.

4. A neutron detection device as claimed in claim 3, wherein the barrier layer comprises silicon nitride.

5. A neutron detection device as claimed in claim 1, wherein the neutron conversion layer comprises boron.

6. A neutron detection device as claimed in claim 1, wherein the neutron conversion layer comprises boron-containing glass.

7. A neutron detection device as claimed in claim 6, wherein the boron-containing glass includes 5% boron.

8. A neutron detection device as claimed in claim 1, wherein the neutron conversion layer includes lithium.

9. A neutron detection device as claimed in claim 1, wherein one of the neutron conversion layers comprises boron and the other of the neutron conversion layers comprises lithium.

10. A method of manufacturing a neutron detector from a memory device, wherein the memory device includes an layer active semiconductor layer, a base substrate and an insulating layer between the active semiconductor layer and the base substrate, the method comprising:
    removing the base substrate layer from a memory device to expose the insulating layer; and
    forming a neutron conversion layer on the insulating layer.

11. A method of manufacturing a neutron detector from a memory device as claimed in claim 10, further comprising forming a barrier layer on the insulating layer prior to forming the neutron conversion layer.

12. A method of manufacturing a neutron detector from a memory device as claimed in claim 10, further comprising forming a second neutron conversion layer on the neutron conversion layer.

13. A method of manufacturing a neutron detector from a memory device as claimed in claim 10, wherein the neutron conversion layer comprises boron.

14. A method of manufacturing a neutron detector from a memory device as claimed in claim 12, wherein the neutron conversion layer formed on the insulating layer comprises boron and the second neutron conversion layer comprises lithium.

15. A method of manufacturing a neutron detector from a memory device, wherein the memory device includes an active semiconductor layer, a base substrate and an insulating layer between the active semiconductor layer and the base substrate, the method comprising:
   removing the base substrate layer and the insulating layer from the memory device; and
   forming a neutron conversion layer on the active semiconductor layer.

16. A method of manufacturing a neutron detector from a memory device as claimed in claim 15, further comprising forming a barrier layer on the active semiconductor layer prior to forming the neutron conversion layer.

17. A method of manufacturing a neutron detector from a memory device as claimed in claim 15, further comprising forming a second neutron conversion layer on the neutron conversion layer formed on the active semiconductor layer.

18. A method of manufacturing a neutron detector from a memory device as claimed in claim 15, wherein the neutron conversion layer comprises boron.

19. A method of manufacturing a neutron detector from a memory device as claimed in claim 17, wherein the neutron conversion layer formed on the insulating layer comprises boron and the second insulating layer comprises lithium.

20. A neutron detection device comprising:
   an active semiconductor layer including a plurality of charge-sensitive cells; and
   a neutron conversion layer located under the active semiconductor layer.

21. A neutron detection device as claimed in claim 20, further comprising an insulating layer located between the active semiconductor layer and the neutron conversion layer.

22. A neutron detection device as claimed in claim 20, further comprising a barrier layer located between the neutron conversion layer and the active semiconductor layer.

23. A neutron detection device as claimed in claim 22, wherein the barrier layer comprises silicon nitride.

24. A neutron detection device as claimed in claim 20, wherein the neutron conversion layer comprises boron.

25. A neutron detection device as claimed in claim 20, wherein the neutron conversion layer comprises boron-containing glass.

26. A neutron detection device as claimed in claim 25, wherein the boron-containing glass includes 5% boron.

27. A neutron detection device as claimed in claim 20, wherein the neutron conversion layer includes lithium.

28. A neutron detection device as claimed in claim 20, further comprising a second neutron conversion layer formed in proximity to the active semiconductor layer.

29. A neutron detection device as claimed in claim 28, wherein one of the neutron conversion layers comprises boron and the other of the neutron conversion layers comprises lithium.

30. A neutron detection device comprising:
   an active semiconductor layer including a plurality of charge-sensitive cells;
   a first neutron conversion layer adjacent to the active semiconductor layer; and
   a second neutron conversion layer formed in close proximity to the active semiconductor layer.

31. A neutron detection device comprising an active semiconductor layer including a plurality of charge-sensitive cells;
   a first neutron conversion layer;
   a second neutron conversion layer; and
   an insulating layer located between the active semiconductor layer and the neutron conversion layers.

32. A neutron detection device comprising an active semiconductor layer including a plurality of charge-sensitive cells;
   a first neutron conversion layer;
   a second neutron conversion layer; and
   a barrier layer located between the neutron conversion layer and the active semiconductor layers.

33. A neutron detection device as claimed in claim 32, wherein the barrier layer comprises silicon nitride.

34. A neutron detection device as claimed in claim 30, wherein the neutron conversion layer comprises boron.

35. A neutron detection device as claimed in claim 30, wherein the neutron conversion layer comprises boron-containing glass.

36. A neutron detection device as claimed in claim 35, wherein the boron-containing glass includes 5% boron.

37. A neutron detection device as claimed in claim 30, wherein the neutron conversion layer includes lithium.

38. A neutron detection device as claimed in claim 30, wherein one of the neutron conversion layers comprises boron and the other of the neutron conversion layers comprises lithium.

39. A neutron detection device comprising:
   an active semiconductor layer including a plurality of charge-sensitive cells;
   a first neutron conversion layer in contact with the active semiconductor layer; and
   a second neutron conversion layer formed in proximity to the active semiconductor layer.

40. A neutron detection device as claimed in claim 39, wherein the neutron conversion layer comprises boron.

41. A neutron detection device as claimed in claim 39, wherein the neutron conversion layer comprises boron-containing glass.

42. A neutron detection device as claimed in claim 41, wherein the boron-containing glass includes 5% boron.

43. A neutron detection device as claimed in claim 39, wherein the neutron conversion layer includes lithium.

44. A neutron detection device as claimed in claim 39, wherein one of the neutron conversion layers comprises boron and the other of the neutron conversion layers comprises lithium.

45. A neutron detection device comprising:
   an active semiconductor layer including a plurality of charge-sensitive cells;
   a neutron conversion layer located within a distance from the active semiconductor layer no greater than the range of neutron reactant product particles traversing the distance; and
   a second neutron conversion layer formed in proximity to the active semiconductor layer.

46. A neutron detection device as claimed in claim 45, further comprising an insulating layer located between the active semiconductor layer and the neutron conversion layers.

47. A neutron detection device as claimed in claim 45, further comprising a barrier layer located between the neutron conversion layer and the active semiconductor layers.

48. A neutron detection device as claimed in claim 47, wherein the barrier layer comprises silicon nitride.

49. A neutron detection device as claimed in claim 45, wherein the neutron conversion layer comprises boron.

50. A neutron detection device as claimed in claim 45, wherein the neutron conversion layer comprises boron-containing glass.

51. A neutron detection device as claimed in claim 50, wherein the boron-containing glass includes 5% boron.

52. A neutron detection device as claimed in claim 45, wherein the neutron conversion layer includes lithium.

53. A neutron detection device as claimed in claim 45, wherein one of the neutron conversion layers comprises boron and the other of the neutron conversion layers comprises lithium.

\* \* \* \* \*